United States Patent [19]
Chan

[11] Patent Number: 6,147,899
[45] Date of Patent: Nov. 14, 2000

[54] RADIATION HARDENED SRAM DEVICE HAVING CROSS-COUPLED DATA CELLS

[75] Inventor: Tsiu Chiu Chan, Carrollton, Tex.

[73] Assignee: STMicroelectronics, Inc., Carrollton, Tex.

[21] Appl. No.: 09/452,073

[22] Filed: Nov. 30, 1999

[51] Int. Cl.$^7$ .................................................. G11C 11/412
[52] U.S. Cl. ......................... 365/156; 365/154; 365/190
[58] Field of Search .................................... 365/154, 156, 365/190, 185.07

[56] References Cited

U.S. PATENT DOCUMENTS

| | | | |
|---|---|---|---|
| 4,251,876 | 2/1981 | McKenny et al. | 365/182 |
| 5,631,863 | 5/1997 | Fechner et al. | 365/156 |
| 5,732,015 | 3/1998 | Kazerounian et al. | 365/154 |
| 5,905,290 | 5/1999 | Houston | 257/380 |

Primary Examiner—Andrew Q. Tran
Attorney, Agent, or Firm—David V. Carlson; Theodore E. Galanthay; Lisa K. Jorgenson

[57] ABSTRACT

A memory cell with increased resistance to high energy particle radiation. When a memory cell is subjected to high energy particles hit, such as may occur in outer space or in certain harsh environments, design is provided that ensures the data will be maintained in its current state. In particular, a pair of WORD lines access the memory cell such that either WORD line being enabled provides access to the data in the memory cell. The memory cell contains two data storage cells. Each data storage cell contains a pair of cross-coupled transistors which are indirectly cross-coupled to each other via an isolation device. Further, each of the two data storage cells are cross-coupled to each other to reinforce and maintain the data in the respective cross-coupled data storage cell. In the event data is at risk in one of the data storage cells, the other storage cells maintains the data at the correct level at all times. Further, the cross-coupling from one data storage cell to the other acts to restore the original data state in the cross-coupled cell once the high energy particle hit is over.

19 Claims, 1 Drawing Sheet

RADIATION HARDENED SRAM DEVICE HAVING CROSS-COUPLED DATA CELLS

TECHNICAL FIELD

This invention relates to a memory cell, and in particular to a memory cell which is resistant to data loss when subjected to high energy particles as may be present in outer space, or subjected to other high energy environment, or event.

BACKGROUND OF THE INVENTION

Electronic equipment, notably memories are often used in environments where they are or may be subjected to high energy particles. They may also be subjected to a high energy electromagnetic pulse field. Such particles may include alpha, beta, gamma and other particles which have sufficient energy to pass through the outer surface of a plastic case and impact the memory cell itself.

Outer space is one environment in which a memory cell would be subjected to impact from a high energy particle. When the sun has an energy eruption, which occurs with increasing frequency and intensity during high activity sunspot cycles, the likelihood of impact of a high energy particle on objects orbiting the Earth becomes extremely high. Other environments, such as a nuclear explosion or a lightning strike may also produce high energy particles or a high energy electromagnetic pulse (EMP).

Many integrated memory circuits in use today have a reverse biased PN junction that will be shorted due to charges generated by the high energy particle hit. If this happens to a standard memory cell, the logic state of the cell becomes unknown. It may be inverted, or the data may be erased. Accordingly, current memory cells must either be protected from high energy particle hit, or on the other hand designed in such way that they are resistant to a change in data state even if hit by a high energy particle or exposed to a high energy EMP.

SUMMARY OF THE INVENTION

According to principles of the present invention, a memory cell is designed comprised of two mutually coupled data cells. Each data cell contains six transistors and two polysilicon load resistors. One of the data cells is composed solely of N-channel transistors and the other cell is composed solely of P-channel transistors. The data cells are coupled together through a respective pull-down leg coupled to each data node.

The memory cell design renders the data stored in the cell resistant to change when impacted by a high energy particle. Certain high energy particles may cause some or all of the N-channel transistors to be shorted or lose their data state. In such an event, the P-channel transistors are fully duplicative and have stored the data state and can restore it to the N-channel transistors. For some types of high energy particle impacts, the P-channel transistors may be shorted to their body, which is at VCC potential instead of a ground. Thus, the type of particle which would cause the N-channel transistors to be shorted may not cause shorting nor loss of data in the P-channel transistors and similarly, the type of particle which will cause shorting or loss of data in the P-channel transistors may not have such an effect on the N-channel transistors. Thus, if the particle causes some or all of the P-channel transistors to be shorted to their body, the data state can be restored by the N-channel transistors or vise-versa and the original state of the data is therefore maintained regardless of the event or type of particle which hits the cell.

DETAILED DESCRIPTION OF THE INVENTION

Figure 1:
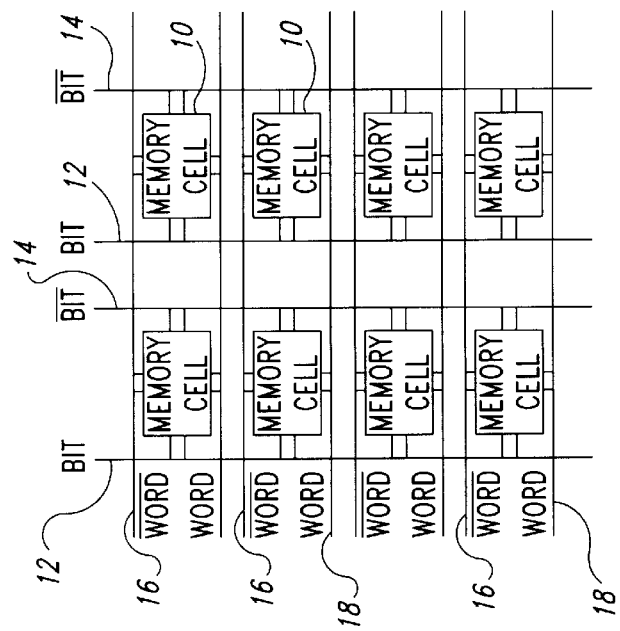
FIG. 1 is a block diagram of a memory cell array according to principles of the present invention.

FIG. 1 illustrates an array of memory cells 10 arranged in rows and columns. Each memory cell has a BIT line 12 and a $\overline{\text{BIT}}$ line 14 connected thereto. Each memory cell also has a WORD line 18 and a $\overline{\text{WORD}}$ line 16 connected thereto.

The memory cell can be accessed by taking the WORD line 18 high which transfer data on the BIT line 12 to the memory cell and the inverted value of the stored data on $\overline{\text{BIT}}$ line 14 to an opposite node of the memory cell. Further, the memory cell can be fully accessed by taking $\overline{\text{WORD}}$ line 16 low which will also place the data on the BIT line and the inverse of the data on the $\overline{\text{BIT}}$ line into the memory cell. Under most operational circumstances, it will be appreciated that WORD line 18 and $\overline{\text{WORD}}$ ine 16 will always be opposite to each other. When WORD line 18 goes high, $\overline{\text{WORD}}$ line 16 will normally transition low simultaneously. In addition, when WORD line 18 is low, $\overline{\text{WORD}}$ line 16 will normally be high, blocking access to the memory cell. The WORD lines are on opposite sides of the memory cell and thus if one of the WORD lines becomes non-operational, the other WORD line is more likely to survive and remain operational.

There may be some conditions, particularly during tests or certain harsh environment conditions during which one of the two WORD lines to a particular row of memory cells is not operated. For example, there may be certain test conditions in which it is desired to operate only at one of the two WORD lines to the row of memory cells and leave the other WORD line, whether $\overline{\text{WORD}}$ line, inactivated. It may also be the case that one of the two WORD lines to the row of memory cells is rendered defective or nonoperational for various reasons, including failure due to an electrical or physical problem and the other WORD line will be sufficiently effective to provide full access to the memory cell.

If one of the two WORD lines to the row of memory cells becomes disabled, the other WORD line is able to fully access the entire row of memory cells for reading data in or data out of the row. Having one of the two WORD lines does not cause the row of memory cells to be defective, it merely means that it cannot be accessed through that particular WORD line. Since each row of memory cells has two WORD lines, the row of memory cells can be enabled and accessed provided via the other WORD line in the event one is destroyed.

Figure 2:
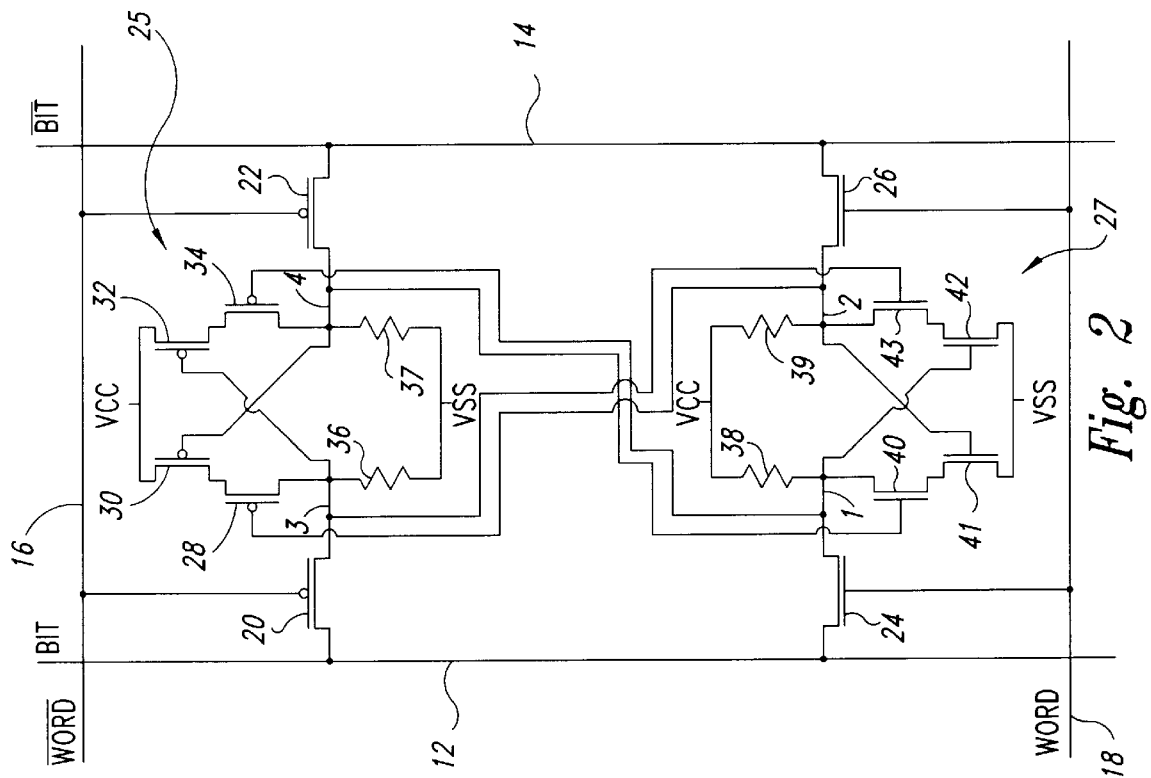
FIG. 2 is a circuit schematic diagram of a memory cell according to principles of the present invention.

FIG. 2 illustrates one example of a circuit implementation for a memory cell according to principles of the present invention. A first data cell 25 is composed of P-channel transistors 28, 30, 32 and 34. Access transistors 20 and 22 provide access for transferring data into and out of the data cell 25.

Memory cell 25 also includes polysilicon load resistors 36 and 37 having one end coupled to the respective data storage nodes 3 and 4 and the other end coupled to VSS. The polysicon load resistors serve to provide sufficient charge transfer so the state of the data is maintained in its proper value, as is well known for polysilicon load resistors and described in U.S. Pat. No. 4,251,876, incorporated herein by reference.

The two WORD lines, WORD line 18 and $\overline{\text{WORD}}$ line 16 are coupled respectively to access transistors for the memory cell. $\overline{\text{WORD}}$ line is connected to access transistors 20 and 22. These access transistors are P-channel transistors so that they are disabled when $\overline{\text{WORD}}$ line is high and are enabled when $\overline{\text{WORD}}$ line transitions to low. Access transistors 24 and 26 are connected to WORD line 18, these access transistors being of the N-channel type so that they are enabled when the WORD line goes high and are disabled when the WORD line goes low.

Data is stored on nodes 3 and 4 in data cell 25. For example, when node 3 is at a high state and node 4 is at a low state, the memory cell stores a 1. When access transistor 20 is enabled, a 1 can be read from node 3 onto the BIT line 12. Correspondingly, a 0 is stored at node 4 and when access transistor 22 is enabled, a 0 is read onto the $\overline{\text{BIT}}$ line 14.

Transistors 30 and 32 are cross-coupled to each other with an isolation transistor in the cross-coupling connection as will now be explained. P-channel transistors 30 and 32 are cross-coupled to each other and act to retain the data on the storage nodes 3 and 4.

The gate of transistor 30 is coupled to the drain of transistor 32. However, this coupling is an indirect coupling because an isolation transistor, namely transistor 34 is connected between the drain of transistor 32 and the gate of transistor 30. Similarly, the gate of transistor 32 is connected to the drain of transistor 30, however, this is an indirect connection because transistor 28 is interposed as a series connection between the drain of transistor 30 and the gate of transistor 32. These isolation transistors 28 and 34 act as isolation devices to prevent a change in data state when a high energy particle hits that would otherwise affect the data state stored in the data cell 25.

N-channel data cell 27 has a similar design. Polysilicon load resistors 38 and 39 couple data storage notes 1 and 2 to VCC to maintain the charge at the currently stored level. Transistors 40, 41, 42 and 43 are coupled to maintain the state of the data stored on nodes 1 and 2. In particular, transistors 41 and 42 are crossed coupled to each other having their gates connected respectively to the drains of each other. The gates, however, are not directly connected to the drains of each other and an isolation device is positioned between the connection. In particular, N-channel transistor 40 is coupled between the data storage node 1 and the drain of transistor 41. The gate of transistor 42 is therefore connected to the drain of transistor 41, however, it is an indirect connection because it is coupled through isolation transistor 40. Similarly, the gate of transistor 41 is coupled to the drain of transistor 42 which is also coupled to the data storage node 2. Isolation transistor 43 interposed between the data storage node 2 and the drain of transistor 42 so that the gate of transistor 41 is directly coupled to the data storage node, but indirectly connected to the drain of transistor 42.

The isolation devices are cross-coupled from memory cell 25 to memory cell 27 in order to provide enhanced isolation and data restoration capabilities. In particular, the gate of transistor 43 is coupled to data storage node 3. The state of data storage node 3 therefore serves to reinforce and maintain the state of transistor 43. Similarly, the gate of isolation transistor 40 is coupled to data storage node 4 so the value on the data storage node 4 serves to reinforce and confirm the state of isolation transistor 40.

The gate of transistor 34 is coupled to data storage node 1 while the gate of transistor 28 is coupled to data storage node 2. Accordingly, the state on the respective gates of isolation transistors 28 and 34 is maintained and reinforced by the value stored in the data nodes of the other memory cell 27.

The operation of the device and its resistance to high energy particle hits will now be explained. Assume as a first example during operation that the memory cell has stored a logic state of 1. A 1 is a high value stored respectively on nodes 1 and 3. During the steady state condition, the memory cell is deselected so that the WORD line 18 is disabled, in this case low, and $\overline{\text{WORD}}$ line 16 is also disabled, which for a P-channel transistor occurs when $\overline{\text{WORD}}$ line 16 is a high. With a 1 stored at node 1, the value on the gate of transistor 42 is a 1, thus turning transistor 42 on and shorting its drain to ground. Transistor 43 has its gate connected to node 3, which is also a 1, which will also connect its drain potential to the source potential, which in this case is ground. Accordingly, node 2 is reinforced at the zero, that is ground value and held there by transistors 42 and 43 both being on. Similarly, transistors 30 and 28 are held on by their respective gates being coupled to ground so that node 3 is also held at a high value. Since these are P-channel transistors, VCC is provided from their source through to their drain to hold a 1 on the data storage node. On the other hand, N-channel transistors 40 and 41 have their gates respectfully coupled to a low voltage source so that the transistors are ensured of being off. The gate of transistor 41 is coupled to the second data storage node which has been assured to being at a low value, while the gate of transistor 40 is coupled to node 4, which is also assured of being at a low value. Transistors 34 and 32 are held off because their respective gates are connected to VCC, or a high value. The memory is retained indefinitely in this state in the memory storage cells. Particularly, a 1 is maintained independently on node 1 and node 3. When either or both of the WORD lines enables access to the respective memory cells, the data is read out on BIT line 12 and the inverse data read on a $\overline{\text{BIT}}$ line 14. The reading of the data does not affect, in anyway, the value of the data stored in the respective memory cells.

Assume now that a high energy particle of a type, which causes a shorting in the memory storage cell, strikes the memory cell. This high energy particle shorts one or more of the drains and the sources of the N-channel transistors to which the P-well in which the N-channel transistors are formed, which is grounded. Transistors 40 and 41 are turned on, grounding node 1. This will cause the data in node 1 to be lost and node 1 may transition for a short period of time to ground or some other low voltage. Since node 1 has gone to a low state, transistor 34 is turned on providing potential access to node 4. However, the gate of transistor 32 is cross-coupled to the drain of transistor 30 via isolation device 28. Isolation device 28, having its gate coupled to node 2 is still held in the off position. Even when the high energy particles of the type described strikes the memory cell, node 2 stays at its already low state and thus transistor 28, acting with transistor 30 maintains node 3 at its high value. Transistor 32 therefore maintains the current value of the data at node 4 and does not permit it to transition even though the memory cell has received a high energy particle hit. The isolation device 34 acts to prevent direct influence on transistor 32 so there is complete isolation. Thus, during the high energy particle hit the correct state of the data is still maintained accurately on nodes 3 and 4. After a short period of time and the high energy particle hit has ended, the two off transistors, 32 and 40 will restore the original logic state to the data cell 27. Namely, node 4 will be retained at ground which will reinforce and cause node 1 to return to the high value. Thus, the correct data state of the memory has been preserved even though it was subjected to a high energy particle hit of the type which caused the N-channel transistors to all have the drains and source shorted together and to ground for a brief period of time. Obviously, less traumatic high energy particle hits such as slight charge transfer at a drain or source of an N-channel transistor while the shorting of only one of the transistors in similarly guarded against by the present design.

Resistance to high energy particle hits of the type which cause shorting of one or more of the drains and sources of the P-channel transistors to the N-well in which the P-channel transistors are formed, is also protected against. In a similar way, if one or more of the drains and sources of the P-channel transistors of cell 25 are shorted for a brief period of time, both node 3 and node 4 may appear to have a 1, that is a high value stored therein. Such a high value charge impact will not cause damage or harm to the N-channel cells and they will maintain the data at the correct state on their respective storage notes. The correct value of the data at node 1 is retained and reinforced by the cross-coupled connection of transistor 34 and the isolation device 41 which prevents a 1 at node 4 from causing an impact on the end memory cell. The correct value of the data is maintained at node 1. After a brief period of time, the value of the data at node 1 will act, via the connection to P-channel transistor 34 to restore node 4 to the logic 0 state while the 0 stored at node 2 will act to reinforce and maintain the value of the 1 stored at node 3. Accordingly, after a brief period of time, the value of the data at nodes 2 and 4 is restored to their proper value and the value of the data at nodes 1 and 3 is maintained as accurate.

The improved memory cell device thus provides a radiation hardened SRAM which maintains the data regardless of high energy particle hits of various types. In a preferred embodiment, each of the data cells are positioned in their own independent N-well and P-wells, respectively, a particle hit which causes electrical problems in the P-well will be isolated from the N-well and similarly, high energy particle hits which cause problems in the N-well will be isolated from the P-well, thus the value of the data can be accurately maintained at all times.

P-channel transistors of data cell 25 are preferably constructed in an isolated N-well. The N-channel transistors of data cell 27 are preferably constructed in an isolated P-well. This provides the advantage that the cells 27 and 25 are constructed in isolated, separate wells and thus have further insulation from high energy particle heads causing loss of data in both cells at the same time.

In one embodiment, the access transistors for the N-channel cell 27, transistors 24 and 26, are also in the same well as the cell 27 itself. However, they can also be positioned in a separate isolated well if desired. Similarly, transistors 20 and 22 can be in the same P-well as the cell 25 or, in an isolated well depending on the preferred design structure.

Isolation devices 28 and 34 that provide the indirect connection for the cross-coupling between transistors 30 and 32 and thus isolation have been described as P-channel transistors. In an alternative embodiment, other isolation devices could be used. For example, in some embodiments, a diode or other active device should be used for providing some degree of isolation. Similarly, some modification of the design may be possible to permit use of N-channel transistors as the isolation devices for the cross-coupled P-channel transistors and vice versa. Accordingly, the present invention is directed towards all embodiments that fall within the concept thereof as covered by the claims.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A memory cell comprising:
   a first data cell having two cross-coupled transistors with a first and second data storage nodes at each of their respective gates;
   a second data cell having two cross-coupled transistors with a third and fourth data storage nodes at each of their respective gates;
   a first isolation circuit connected between the cross-coupled transistors of the first data cell so that the transistors are cross-coupled to each other indirectly via the first isolation circuit; and
   a second isolation circuit connected between the cross-coupled transistors of the second data cell so that the transistors are cross-coupled to each other indirectly via the second isolation circuit.

2. The memory cell of claim 1 wherein each circuit is comprised of two isolation transistors.

3. The memory cell of claim 2 wherein the isolation transistors are of the same conductivity type as the transistors which are cross-coupled together for which they are providing isolation.

4. The memory cell according to claim 2 wherein the gates of the first isolation transistors of the first data cell are respectively coupled to the respective data storage nodes of the second data cell and the gates of the second isolation transistors of the second data cell are respectively coupled to the storage nodes of the first data cell.

5. The memory cell according to claim 1, further including a first WORD line coupled to the first data cell.

6. The memory cell according to claim 5, further including a second WORD line coupled to the second data cell such that two WORD lines are coupled to the memory cell.

7. The memory cell according to claim 1, further including a pair of BIT lines coupled to the memory cell.

8. The memory cell according to claim 7, further including a pair of access transistors for connecting the data storage nodes of the second data cell to the pair of bit lines, respectively.

9. The memory cell according to claim 1 wherein a single BIT line is coupled to both the first data cell and the second data cell within the memory cell.

10. The memory cell according to claim 1, further including a $\overline{\text{BIT}}$ line connected to both the first data cell and the second data cell within the memory cell.

11. The memory cell according to claim 1, further including a pair of WORD lines connected to the memory cell, such that enabling either WORD line will activate the memory cell to output data.

12. The memory cell according to claim 1, further including a first pair of polysilicon load resistors coupled between the first and second data storage nodes of the first data cell and a first reference voltage; and
   a second pair of polysilicon load resistors coupled between the third and fourth data storage nodes of the second data cell and a second reference voltage.

13. The memory cell according to claim 12 wherein all transistors in the first data cell are P-channel transistors and the first reference voltage is ground voltage.

14. The memory cell according to claim 12 wherein all transistors in the second data cell are N-channel transistors and the second reference voltage is a positive voltage above ground voltage.

15. An SRAM memory cell comprising:
    a first data cell having a first pair of transistors coupled in series between a first reference voltage and a first data storage node;
    a second pair of transistors coupled in series between the first reference voltage and a second data storage node;
    an electrical connection between the gate of a transistor of the first pair of transistors and the second data storage node;
    an electrical connection between the gate of a transistor of the second pair of transistors and the first data storage node;
    a first polysilicon load resistor coupled from a second reference voltage to the first data storage node; and
    a second polysilicon load resistor coupled from the second reference voltage to the second data storage node.

16. The SRAM memory cell according to claim 15, further including a first access transistor coupled to the first data storage node and to a first BIT line; and
    a second access transistor coupled to the second data storage node and to a second BIT line.

17. The SRAM memory cell according to claim 16, further including a WORD line coupled to the gates of the first and second access transistors.

18. The SRAM memory cell according to claim 15, further including a second data cell comprised of:
    a third pair of transistors connected in series between the second reference voltage and a third data storage node;
    a fourth pair of transistors connected in series between the second reference voltage and a fourth data storage node;
    a third polysilicon load resistor connected between the first reference voltage and the third data storage node;
    a fourth polysilicon load resistor connected between the first reference voltage and the fourth data storage node;
    an electrical connection between a gate of a transistor of the third pair of transistors and the fourth storage node; and
    an electrical connection between a gate of a transistor of the fourth pair of transistors and the third data storage node.

19. The SRAM memory cell according to claim 18, further including:
    an electrical connection between a gate of the other transistor of the first pair of transistors and the fourth data storage node;
    an electrical connection between a gate of the other transistor of the second pair of transistors and the third data storage node;
    an electrical connection between a gate of the other transistor of the third pair of transistors and the second data storage node; and
    an electrical connection between a gate of the other transistor of the fourth pair of transistors and the first data storage node.

* * * * *